United States Patent
Endres et al.

(10) Patent No.: US 7,777,186 B2
(45) Date of Patent: Aug. 17, 2010

(54) PIXEL INTERCONNECT INSULATORS AND METHODS THEREOF

(75) Inventors: Darrel W. Endres, West Chester, OH (US); Richard Rawe, Melbourne, KY (US); Charles Martin, West Chester, OH (US)

(73) Assignee: L-3 Communications Cincinnati Electronics Corporation, Mason, OH (US)

( * ) Notice: Subject to any disclaimer, the term of this patent is extended or adjusted under 35 U.S.C. 154(b) by 58 days.

(21) Appl. No.: 12/191,596

(22) Filed: Aug. 14, 2008

(65) Prior Publication Data

US 2010/0038539 A1 Feb. 18, 2010

(51) Int. Cl.
 *H01L 25/00* (2006.01)
(52) U.S. Cl. ..................................... 250/332
(58) Field of Classification Search .................. 250/332
 See application file for complete search history.

(56) References Cited

U.S. PATENT DOCUMENTS

| | | | |
|---|---|---|---|
| 5,047,644 | A | 9/1991 | Meissner et al. |
| 5,264,699 | A | 11/1993 | Barton et al. |
| 5,304,500 | A | 4/1994 | Timlin et al. |
| 5,539,206 | A | 7/1996 | Schimert |
| 5,627,082 | A | 5/1997 | Beratan et al. |
| 5,700,715 | A | 12/1997 | Pasch |
| 6,232,563 | B1 | 5/2001 | Kim et al. |
| 6,399,178 | B1 | 6/2002 | Chung |
| 6,399,426 | B1 | 6/2002 | Capote et al. |
| 6,423,573 | B1 | 7/2002 | Gidon |
| 6,432,741 | B1 | 8/2002 | Mueller et al. |
| 6,506,681 | B2 | 1/2003 | Grigg et al. |
| 6,678,949 | B2 | 1/2004 | Prasad et al. |
| 6,750,072 | B2 | 6/2004 | Buchanan et al. |
| 6,798,030 | B1 | 9/2004 | Izumi et al. |
| 6,800,946 | B2 | 10/2004 | Chason et al. |
| 6,821,878 | B2 | 11/2004 | Danvir et al. |

(Continued)

FOREIGN PATENT DOCUMENTS

EP 0831535 8/2005

(Continued)

OTHER PUBLICATIONS

"Industrialization and application development of cyclo-olefin polymer," Masahiro Yamazaki, "Journal of Molecular Catalysis" A: Chemical 213 (2004) 81-87.

*Primary Examiner*—David P Porta
*Assistant Examiner*—Mindy Vu
(74) *Attorney, Agent, or Firm*—Dinsmore & Shohl LLP

(57) ABSTRACT

According to one embodiment, an infrared focal plane comprises an array of pixels configured to detect optical radiation in a predetermined radiation band are positioned on a support substrate. The pixels are connected to pixel contacts on a read-out integrated circuit via pixel interconnects comprising bonding bumps. According to some embodiments, indium migration is blocked by a patterned electrical insulator comprising a plurality of intersecting walls defining a plurality of cells that surround each pixel interconnect. The patterned electrical insulator may be dimensioned such that it does not physically contact the support substrate, the array of pixels or pixel interconnects. In this manner, pixel-pair defects due to indium migration resulting from cryogenic thermal-cycling may be prevented, thereby extending the thermal-cycling lifetime of the focal plane array.

24 Claims, 4 Drawing Sheets

U.S. PATENT DOCUMENTS

| | | |
|---|---|---|
| 6,828,545 B1 | 12/2004 | Hamilton, Jr. et al. |
| 6,864,552 B2 | 3/2005 | Razeghi |
| 7,129,417 B2 | 10/2006 | Cannon et al. |
| 7,229,219 B2 | 6/2007 | Lee et al. |
| 2001/0008309 A1 | 7/2001 | Iijima et al. |
| 2005/0116260 A1* | 6/2005 | Razeghi ............... 257/222 |
| 2005/0266670 A1 | 12/2005 | Lin et al. |
| 2006/0078744 A1* | 4/2006 | Liao et al. ............ 428/412 |
| 2007/0076481 A1 | 4/2007 | Tennant |
| 2007/0164417 A1 | 7/2007 | Todd et al. |
| 2007/0292983 A1 | 12/2007 | Kriman et al. |

FOREIGN PATENT DOCUMENTS

| | | |
|---|---|---|
| JP | 06236981 | 2/1993 |
| JP | 07153905 | 11/1993 |
| JP | 2003234461 | 8/2003 |

* cited by examiner

PIXEL INTERCONNECT INSULATORS AND METHODS THEREOF

TECHNICAL FIELD

Embodiments relate generally to pixel interconnect insulators for cryogenic infrared focal plane arrays, and in particular, embodiments relate to prevention of indium migration resulting from cryogenic thermal cycling of the infrared focal plane array.

BACKGROUND

An infrared focal plane array (FPA) is an imaging sensing apparatus that includes an array of pixels capable of detecting photons in the infrared spectrum. The pixels of infrared FPAs are formed of a material that is sensitive to infrared radiation, such as indium antimonide (InSb), Mercury Cadium Telluride (MCT), or other infrared-sensitive detector materials. A common approach for fabricating two-dimensional FPAs is to connect the detector pixels to a read-out integrated circuit (ROIC) via pixel interconnects, which are typically indium bumps located between the detector pixel contacts and the inputs to the ROIC. The ROIC may include CMOS integrated circuitry such as a multiplexer or other similar circuit, for example. An FPA consisting of a detector array and ROIC may also be attached to another substrate material (the FPA substrate), which provides electrical connections from the external system electronics to the FPA. In order to function properly, cryogenic infrared FPAs operate at very cold temperatures (typically less than 100 Kelvin). Special design considerations are required for cryogenic FPAs to address thermally induced stresses in the devices that result from the temperature cycling process.

Two common types of infrared FPAs include backside-illuminated and frontside-illuminated designs. Backside-illuminated FPAs consist of a monolithic infrared detector material connected to a ROIC by means of electrical interconnects, such as indium bumps. The interconnect area is usually backfilled with epoxy to hold the structure together during subsequent fabrication steps such as thinning of the detector material. Backside-illuminated FPAs are usually limited in application to small to medium size FPAs (i.e., less than $1\times10^6$ pixels) because high stresses develop between the monolithic infrared detector material, the indium bumps, the ROIC and the epoxy during cryogenic thermal cycling of the FPA.

Frontside-illuminated, backside-reticulated FPAs, on the other hand, consist of an infrared detector material (such as InSb) that has been etched to physically separate the pixels in the detector array (i.e., reticulated). The detector array is attached to a transparent silicon support wafer to provide support for the array. The support wafer is transparent in the infrared spectral region. Like backside-illuminated FPAs, the detector array is connected to a silicon ROIC by means of indium bump pixel interconnects. However, unlike the backside-illuminated FPA design, epoxy backfilling is not required because the detector array and the ROIC are both primarily composed of silicon, and therefore the thermal properties of the entire FPA are matched, which results in minimal stress during cryogenic thermal cycling. Frontside-illuminated, backside-reticulated FPAs are robust, and can be thermally cycled thousands of times. This FPA design is scalable from small formats to very large formats. For example, infrared FPAs with greater than $4\times10^6$ pixels are in production.

Because pixels such as InSb and MCT, for example, detect infrared radiation effectively at cryogenic temperatures, the infrared FPA must capable of withstanding cryogenic thermal cycling, which is commonly between 373 Kelvin (100° C.) and 77 Kelvin. As described above, the pixels of frontside-illuminated, backside reticulated FPAs have a physical gap between pixels. Thermal cycling of the FPA has been shown to cause slow migration of the indium bumps into the gap between pixels. After many thermal cycles, indium from one pixel interconnect can migrate across the gap, and physically contact the adjacent pixel interconnect. This contact causes an electrical short between two pixels, forming a "pixel pair" defect. Eventually, if enough pixel-pair defects are formed, the FPA performance will be significantly degraded.

Accordingly, it is desired to provide improvements in FPA design and methods of fabrication that prevent the migration of indium and pixel pair formation due to cryogenic thermal cycling.

SUMMARY

According to one embodiment, an infrared focal plane array is provided. The infrared focal plane array includes a support substrate that is transparent to optical radiation in a predetermined wavelength band. An array of pixels having a gap therebetween are configured to detect optical radiation in the predetermined wavelength band are positioned on the support substrate.

The infrared focal plane array also includes a read-out integrated circuit parallel to the support substrate that further includes an array of pixel contacts that are positioned to correspond and align with the array of pixels. The array of pixels are bonded to the array of pixel contacts via a plurality of pixel interconnects. According to the embodiment, a patterned electrical insulator comprising a plurality of intersecting walls defining a plurality of cells surround each pixel interconnect. The patterned electrical insulator may be dimensioned such that it does not physically contact the support substrate or the array of pixels and pixel interconnects.

According to another embodiment, a method of fabricating a focal plane array is provided. According to the embodiment, the method includes forming an array of pixels capable of detecting optical radiation in a predetermined wavelength band onto a support substrate transparent to optical radiation in the predetermined wavelength band. A patterned electrical insulator is applied to a read-out integrated circuit having an array of pixel contacts corresponding to the array of pixels. According to the embodiment, the patterned electrical insulator comprises a plurality of intersecting walls that are configured to surround the pixels contacts and pixels. The patterned electrical insulator may be configured to surround the pixel interconnects and to not physically contact the support substrate or the array of pixels. The method further includes bonding the array bonding the array of pixels onto the array of pixel contacts with a plurality of corresponding pixel interconnects. The pixel interconnect may comprise a plurality of bonding bumps positioned between individual pixels and pixel contacts.

According to another embodiment, a method of preventing indium migration in a focal plane array is provided. The focal plane array may include a plurality of pixels positioned on a support substrate, a read-out integrated circuit having a plurality of pixel contacts that correspond to the plurality of pixels. The pixels may be connected to the pixel contacts by indium bumps, wherein the pixels, pixel contacts and indium bumps define a plurality of pixel interconnects having a gap therebetween. According to the embodiment, the method includes applying a patterned electrical insulator onto the read-out integrated circuit within the gaps between the pixel interconnects such that the patterned electrical insulator surrounds each pixel interconnect and does not physically contact the transparent substrate or the plurality of pixels.

BRIEF DESCRIPTION OF THE DRAWINGS

The following detailed description will be more fully understood in view of the drawings in which.

Figure 1:
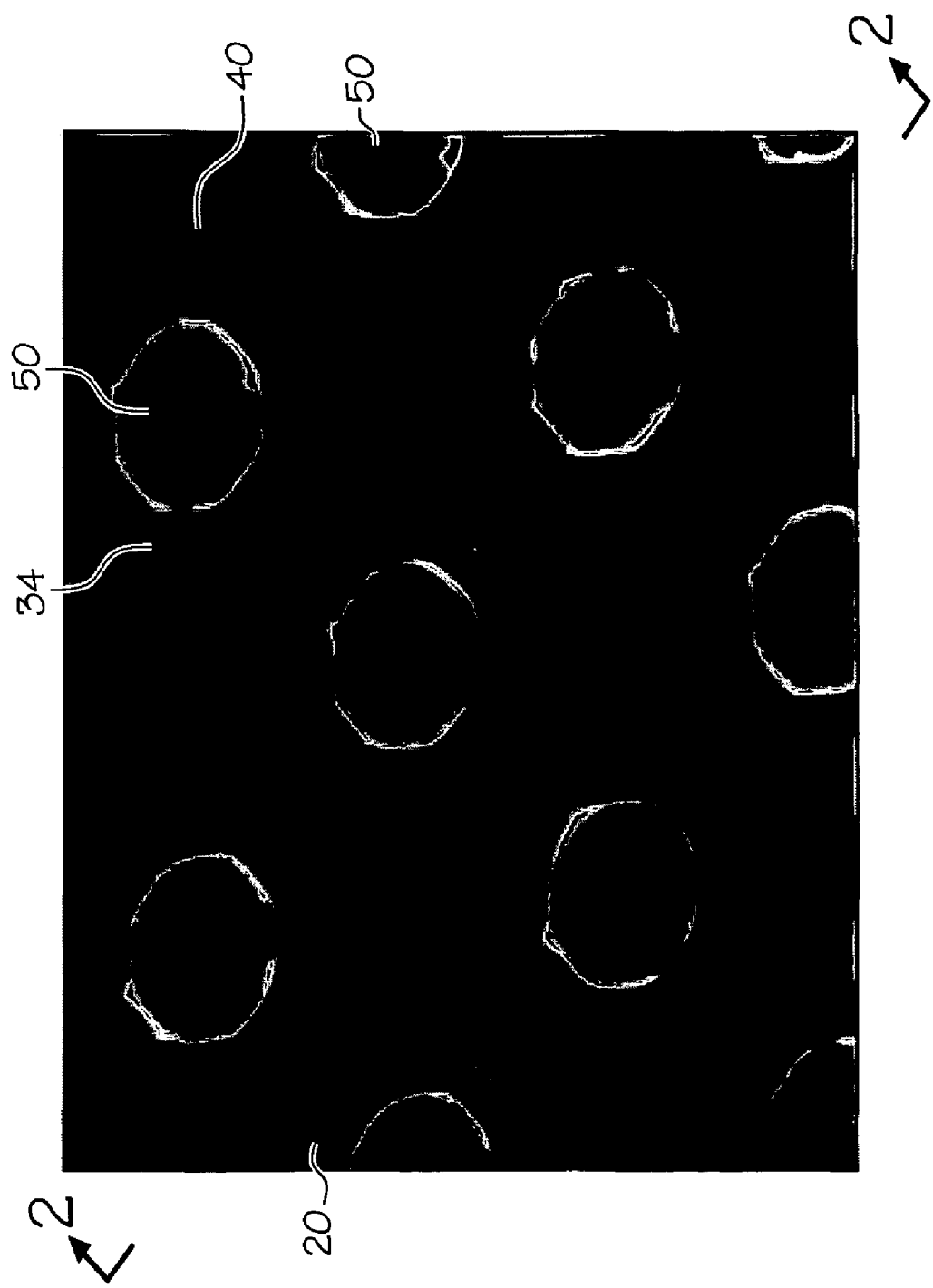
FIG. 1 is a close-up perspective view of a patterned electrical insulator on a read-out integrated circuit substrate according to one or more embodiments of the present invention.

The embodiments set forth in the drawings are illustrative in nature and are not intended to be limiting of the invention defined by the claims. Moreover, individual features of the drawings and the invention will be more fully apparent and understood in view of the detailed description.

DETAILED DESCRIPTION OF ILLUSTRATIVE EMBODIMENTS

In one embodiment, a frontside-illuminated, backside reticulated infrared focal plane array (FPA) comprising a patterned electrical insulator is provided. The patterned electrical insulator prevents the migration of indium bumps that are utilized as pixel interconnects to connect the individual pixels of the pixel array to corresponding pixel contacts located on a read-out integrated circuit (ROIC). Cryogenic thermal cycling of the FPA causes slow migration of the indium bumps and, over time, the indium may traverse the physical gap between pixels and electrically connect two adjacent pixels, thereby forming one or more "pixel pairs." The patterned insulating material is applied in the gap between pixels, and prevents pixel pair formation by blocking indium migration between pixels.

The electrical insulator material, which may comprise an organic polymer, for example, is patterned to surround the individual pixels and may be in the shape of a grid, with the pixels, pixel interconnects and pixel contacts positioned within cells formed by the grid. As FPAs of this type require thousands of thermal cycles, the patterned electrical insulator must be of a resilient nature so that it does not degrade or outgas from such cycles. Additionally, the patterned electrical insulator comprises a material having elastic attributes so that it shrinks and expands during thermal cycling, which in turn reduces induced pressure on pixels during FPA operation. Embodiments have significantly increased lifespans over previous FPA designs, and may be incorporated into many FPA configurations, including those with small pixel pitch (e.g., 25 microns or less), and large format (e.g., greater than $1 \times 10^6$ pixels), for example.

Referring to the embodiment of FIG. 1, a close-up view of a portion of an infrared FPA is shown. The portion of the exemplary FPA illustrated includes a ROIC 20 having an array of pixel contacts 50 arranged in rows and columns displaced on the surface. The pixel contacts have a physical gap between each contact to prevent pixel shorting. The ROIC may be configured as a CMOS circuit which receives signals from the detector pixels at the pixel contacts 50 and then manipulates the signal into data that is readable by a microcontroller, processor, computer or the like. The circuit may comprise components such as multiplexers, analog to digital converters and other circuitry, for example.

According to one embodiment, the ROIC 20 has a patterned electrical insulator 40 that is permanently deposited upon its lateral face and within the gap or space 34 between each pixel contact 50. The geometry of the insulator 40 may be of any geometry so long as the insulator 40 completely surrounds the pixel contact 50. The exemplary insulator as illustrated in FIG. 1 comprises a plurality of intersecting parallel and perpendicular walls forming an array of cells therebetween. The walls of the insulator 40 surround each pixel contact 50.

Figure 2:
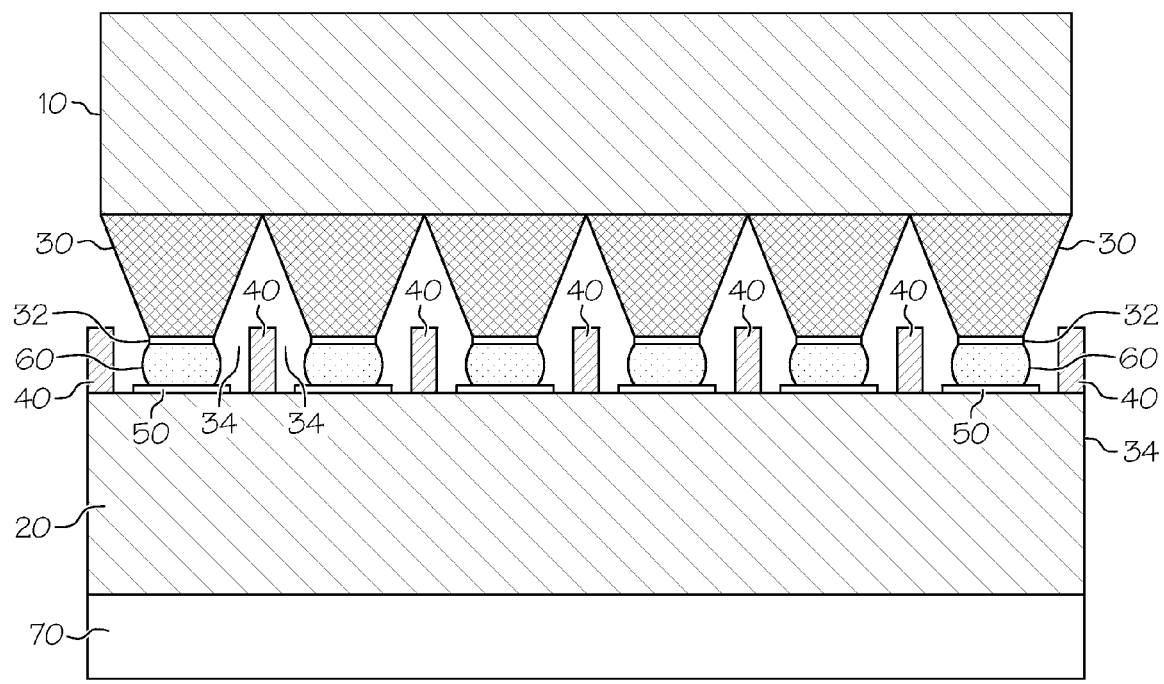
FIG. 2 is a schematic view in cross section of a focal plane array comprising a patterned electrical insulator according to one or more embodiments of the present invention.

FIG. 2 is a schematic in cross-section of an FPA according to some embodiments. In addition to the ROIC 20, the array of pixel contacts 50 and patterned electrical insulator 40, FIG. 2 illustrates a support substrate 10, an array of pixels 30, and an array of bonding bumps 60. The pixels 30 are arranged upon the support substrate 10 to align with corresponding pixel contacts 50 when bonded to the ROIC 20. Like the pixel contacts 50, the pixels 30 may be arranged in rows and columns with a gap or a space 34 between adjacent pixels 30. The pixels 30 may be configured as diodes comprising a material capable of detecting radiation in the infrared wavelength region, such as indium antimonide, and may be formed on the support substrate 10 by reticulation. Various structures and configurations of the pixels, as well as methods of pixel formation and bonding via bonding bumps, are disclosed in U.S. Pat. Nos. 5,227,656 and 5,304,500 to Timlin et al., which are hereby incorporated by reference in their entirety. The support substrate 10 should be of a dielectric that is both capable of withstanding cryogenic cycling and transparent to optical energy in the predetermined wavelength band to be detected (i.e., infrared), such as silicon, for example. Also shown is the FPA substrate 70, on which the bump bonded detector and ROIC may be mounted. The FPA substrate 70 is usually (but not necessarily) larger than the ROIC 20 to accommodate circuitry to connect to external system electronics, and the FPA substrate 70 should also be made primarily from a material that is capable of withstanding thousands of cryogenic thermal cycles, such as silicon, alumina (aluminum oxide), or aluminum nitride.

The support substrate 10 and array of pixels 30 are attached to the ROIC 20 and corresponding pixel contacts 50 via bonding bumps 60. According to the exemplary embodiment of FIG. 2, the bonding bumps 60 are positioned between metal ohmic pads 32 and pixel contacts 50 on the ROIC 20. The bonding bumps 60 may be of a material that is capable of bonding the pixels 30 to the pixel contacts 50, as well as providing electrical communication between the pixels 30 and the ROIC. For example, indium bonding bumps may be utilized to interface the pixels 30 and the ROIC. The area defined by individual pixels 30, bonding bumps 60, and pixel contacts 50 define a pixel interconnect area, which includes the open space between the aforementioned elements.

The exemplary patterned electrical insulator 40 as illustrated in FIG. 2 is located within the pixel interconnect area, i.e., within the gap or space 34 defined by the pixels 30 and pixel contacts 50. The insulator 40 may be dimensioned and positioned such that there is no physical contact between the insulator and the pixels 30, bonding bumps 60, or support substrate 10. More specifically, the insulator 40 is of a width such that it does not physically contact the pixels 30 or bonding bumps 60, and of a height (or thickness) such that it does not physically contact the pixels 30 or support substrate 10 (e.g., a thickness of approximately 5 μm).

The insulator 40 may be made from a material that possesses physical properties such that it has as an effective viscosity so that it may be coated on a surface with a desired uniformity, has a surface adhesion, is electrically insulating, can withstand heating and cryogenic cooling for thousands of cycles without outgassing or degrading, and has thermo-elastic properties that allow it to expand and shrink without causing stress upon the pixel interconnects and substrates. Epoxy backfilling, for example, is not suitable as a pixel interconnect insulator in frontside-illuminated, backside-reticulated infrared FPAs because epoxy has a much different thermal expansion coefficient from the other components of the FPA, which leads to breaks in the pixel interconnects as well as fractures in the support substrate 10 and ROIC 20 during cryogenic cycling. Additionally, epoxy can easily trap pockets of air within the pixel interconnect area, which adversely affects the effectiveness of the radiation detection by introducing artifacts such as nonuniformities into the image obtained by the FPA. Unlike epoxy, the exemplary insulator 40 of FIGS. 1 and 2 as dimensioned and positioned does not trap air pockets within the pixel interconnect area, and does not contact the pixels 30 or any other component during cryogenic thermal cycling.

Figure 3:
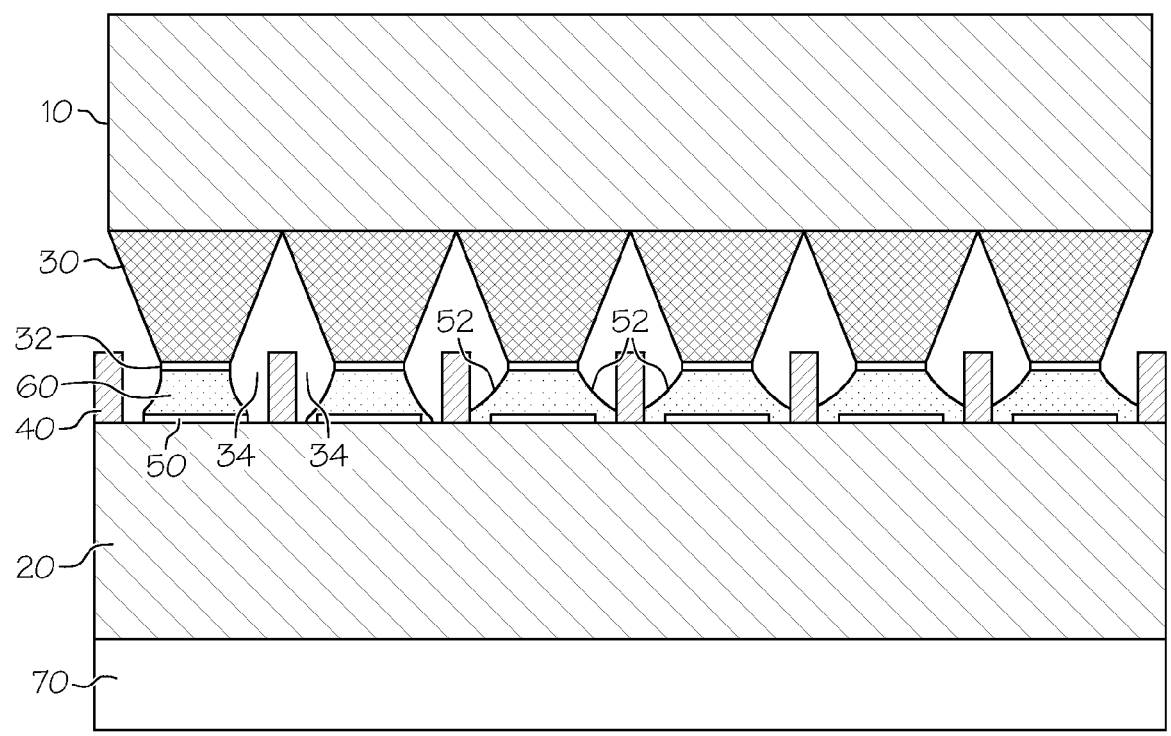
FIG. 3 is a schematic view in cross section of a focal plane array comprising a patterned electrical insulator preventing indium migration according to one or more embodiments of the present invention and FIG. 4 is a close-up perspective view of a patterned electrical insulator preventing indium migration according to one or more embodiments of the present invention.

As described above, the patterned electrical insulator prevents pixel pair defects in the FPA resulting from indium migration. Thermal cycling causes the indium that forms the bonding bumps to slowly migrate across the gap 34 between pixel contacts over time and eventually short adjacent pixels. The insulator 40, which is attached to the ROIC 20 between pixel contacts 50 within the pixel interconnect area, blocks indium migration. FIG. 3 illustrates the slow progression of indium in an exemplary FPA. As may be seen from FIG. 3, the insulator 40 acts as a barrier and blocks the indium migration 52. This barrier prevents pixel pair formation, thereby extending thermal cycling lifespan of the FPA. For example, thermal cycle lifespan extension by a factor of five or more has been demonstrated with the insulator 40. The insulator 40 has also proved valuable to new smaller pitch FPA devices, where the gap or space 34 is more narrow, and indium has less distance to migrate before creating pixel pairs. Preventing pixel pair formation is important as FPA formats continue to get larger and the pixel pitch gets smaller.

Figure 4:
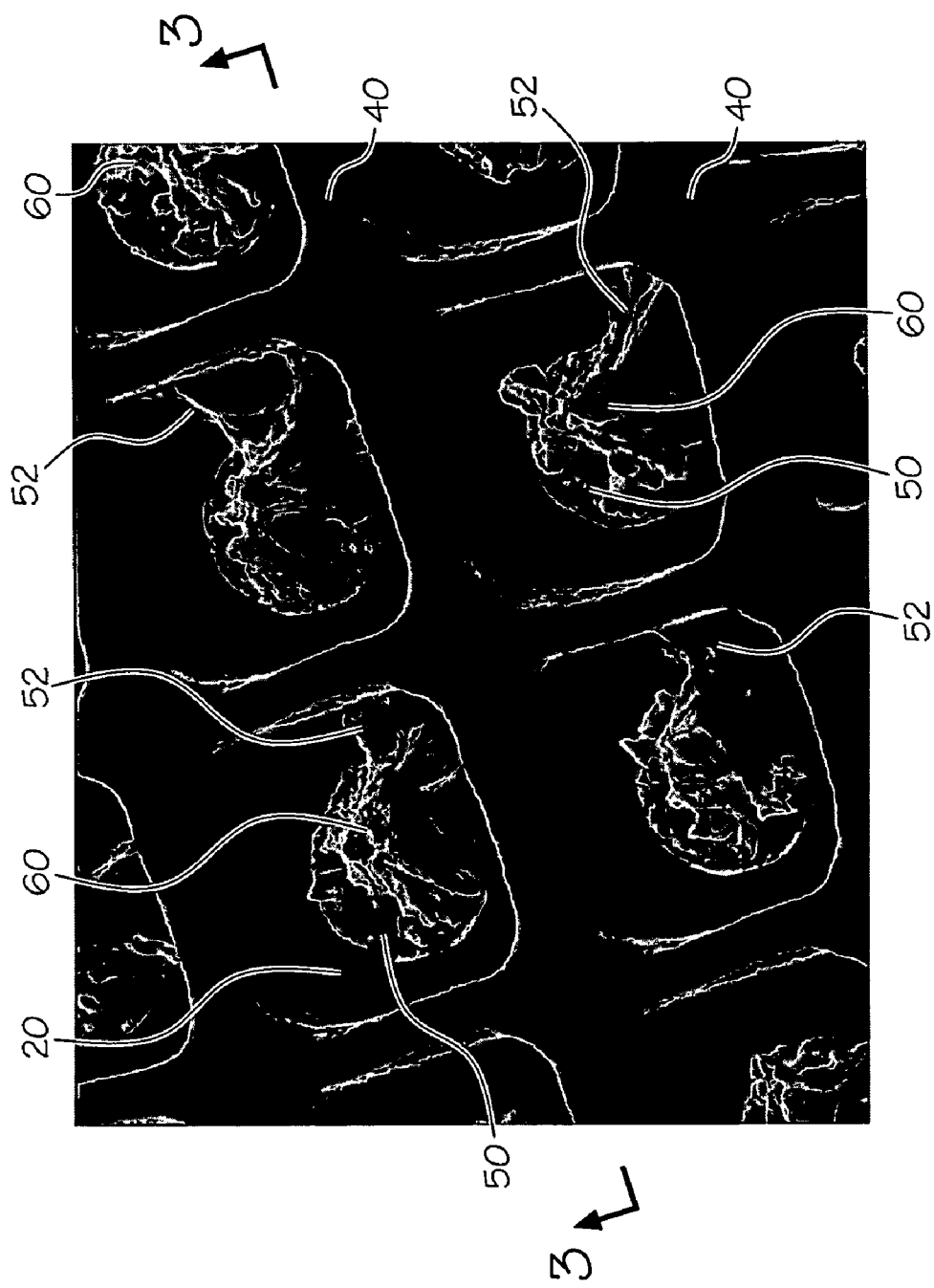

FIG. 4 is a perspective view of a ROIC 20, pixel contacts 50, indium bumps 60 and a patterned electrical insulator 40 after a period of thermal cycling. As a result of the cryogenic thermal cycling, indium has migrated from the pixel contact 50, forming appendages 52 that reach out toward adjacent pixel contacts 50. However, the insulator 40 surrounds each pixel contact 50 and forms a blockade that has prevented the indium appendages from shorting other pixels contacts 50. Without the insulator, pixel pair defects would occur.

Many suitable materials meeting the above criteria or physical properties are available, including dielectric materials such as organic polymers. An organic polymer such as photosensitive a cyclic olefin polymer, has been shown to be a suitable material for the insulator. Other materials, such as polyimide coatings, SU-8 photoresist, and spin-on glass (SOG), for example, may also meet the requirements for use as pixel-insulating materials in FPAs.

A cyclic olefin polymer was tested as the insulator 40 material and experienced no outgassing or degradation such as cracking or shape changing during 10,000 thermal cycles. Thermal cycling may take place in an integrated detector cooler assembly (IDCA), in which the FPA is mounted to a cold finger, and sealed in a high-vacuum (less than $1 \times 10^{-6}$ torr) environment. Particularly, if the insulator material were to release a vapor phase component (i.e., outgassing) within the pixel interconnect area, it could raise the pressure of the FPA above a critical point in which the gas would transfer heat from the outer walls of the IDCA, which are at ambient temperature, to the cold finger chilling the device, which should reach 77 Kelvin temperature for optimum FPA operation. Convection transfer of heat in such a manner makes it very difficult to keep the FPA cold during operation. No significant outgassing of the cyclic olefin polymer has been identified in thermal cycle testing. Additionally, the polymer possesses elastic properties so that thermal stress during thermal cycling is effectively reduced and therefore, no fractures occurred during the cyclings.

The patterned electrical insulator 40 may be applied to the ROIC 20 during fabrication of the FPA. For example, a layer of a photosensitive organic polymer such as a polynorbomene polymer, is deposited onto the surface of the ROIC 20 with an adequate control of thickness (e.g., 5 microns) and uniformity. The insulator becomes a permanent structure of the ROIC 20 and subsequent FPA. The polymer is then be cured to drive off excess solvent, which may be achieved by heating the assembly to an appropriate temperature (such as 100° C.) for one minute by using a hotplate or an oven, or other similar heating device.

After curing, a mask having a pattern defined by the intersecting walls of the desired insulator 40 may be applied to surface of the cured polymer. A photomask, patterned according to the placement of the pixel contacts 50, such that the walls of the insulator are of the desired width and length, is used to expose the polymer to a suitable light source, such as Ultraviolet (UV) radiation (or other processes known to one skilled in the art) through the mask. Exposure to UV light results in further polymerization in the exposed areas of the material, making it difficult to dissolve in solvents. The UV exposed polymer pattern is subsequently developed by dissolving the non-exposed material with an appropriate developer solvent, leaving only the UV-exposed material on the surface of the ROIC 20. The develop process may be accomplished by immersion in an appropriate solvent, or spraying with the appropriate solvent while spinning the ROIC 20 on a spinner apparatus. The assembly may then be washed with an organic solvent to rinse off remaining solvent. A plasma ash process, or other process known to one skilled in the art, may then be used to ash off any residual material that may need to be removed from the ROIC 20. The insulator 40 is now patterned to surround the array of pixel contacts 50 on the ROIC as a permanent structure of the ROIC 20 and subsequent FPA. The support substrate 10 and array of pixels 30 may be bonded to the corresponding array of contacts 50 by way of indium bonding bumps formed on the underside of the pixels 30.

It is noted that terms like "usually," and "typically," if utilized herein, should not be read to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the terms "approximately" and "substantially" are utilized herein to represent the inherent degree of uncertainty that may be attributed to any quantitative comparison, value, measurement, or other representation. The terms "approximately" "substantially" are also utilized herein to represent the degree by which a quantitative representation may vary from a stated reference without resulting in a change in the basic function of the subject matter at issue.

The foregoing description of the various embodiments of the invention has been presented for the purposes of illustration and description. It is not intended to be exhaustive or to limit the invention to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the inventions as defined by the claims.

What is claimed is:

1. An infrared focal plane array comprising:
    a support substrate transparent to optical radiation in a predetermined wavelength band;
    an array of pixels positioned on the support substrate, wherein a gap is present between adjacent pixels and the pixels are configured to detect optical radiation in the predetermined wavelength band;
    a read-out integrated circuit parallel to the support substrate comprising an array of pixel contacts positioned on a face of the read-out integrated circuit such that corresponding ones of the array of pixels and pixel contacts are aligned;
    a plurality of pixel interconnects comprising an array of bonding bumps connecting the aligned pixels and pixel contacts; and
    a patterned electrical insulator affixed to the face of the read-out integrated circuit and comprising a plurality of intersecting walls defining a plurality of cells, wherein each pixel interconnect is contained within an individual cell defined by the intersecting walls and the intersecting walls are dimensioned such that the patterned electrical insulator does not physically contact the support substrate, the array of pixels, or the pixel interconnects.

2. An infrared focal plane array as claimed in claim 1 wherein:
    the pixels are arranged in rows and columns on the support structure and the pixel contacts are arranged in corresponding rows and columns on the read-out structure;
    the patterned electrical insulator is configured as a grid comprising substantially parallel and perpendicular intersecting walls; and
    the patterned electrical insulator is positioned on the read-out integrated circuit such that the intersecting walls are located within the gap between adjacent pixels.

3. An infrared focal plane array as claimed in claim 1 wherein the intersecting walls are approximately 5 µm in height and approximately 2 µm in width.

4. An infrared focal plane array as claimed in claim 1 wherein the patterned electrical insulator is further dimensioned such that the insulator does not trap pockets of air in a pixel interconnect area defined by an open area between the support substrate, the read-out integrated circuit, the pixels and pixel interconnects.

5. An infrared focal plane array as claimed in claim 1 wherein the patterned electrical insulator is configured to block migration of the bonding bumps resulting from thermal cycling, thereby preventing electrical shorts between adjacent pixels of the pixel array.

6. An infrared focal plane array as claimed in claim 1 wherein the patterned electrical insulator is substantially free of outgassing during thermal cycling in the range of approximately 373 Kelvin to approximately 77 Kelvin.

7. An infrared focal plane array as claimed in claim 1 wherein the patterned electrical insulator comprises an organic polymer applied to the read-out integrated circuit.

8. An infrared focal plane array as claimed in claim 7 wherein the organic polymer comprises a photosensitive cyclic olefin polymer.

9. An infrared focal plane array as claimed in claim 1 wherein the transparent substrate and the read-out integrated circuit comprise silicon.

10. An infrared focal plane array as claimed in claim 1 wherein individual ones of the array of bonding bumps comprise indium.

11. An infrared focal plane array as claimed in claim 1 wherein:
    the infrared focal plane array further comprises a focal plane array substrate; and
    the read-out integrated circuit is affixed onto the focal plane array substrate.

12. An infrared focal plane array comprising:
    a support substrate transparent to optical radiation in a predetermined wavelength band;
    an array of pixels positioned on the support substrate, wherein a gap is present between adjacent pixels and the pixels are configured to detect optical radiation in the predetermined wavelength band;
    a read-out integrated circuit parallel to the support substrate comprising an array of pixel contacts positioned on a face of the read-out integrated circuit such that corresponding ones of the array of pixels and pixel contacts are aligned;
    a plurality of pixel interconnects comprising an array of bonding bumps connecting the aligned pixels and pixel contacts; and
    a patterned electrical insulator affixed to the face of the read-out integrated circuit and comprising a plurality of intersecting walls defining a plurality of cells;
    wherein:
        each pixel interconnect is contained within an individual cell defined by the intersecting walls;
        the intersecting walls are dimensioned such that the patterned electrical insulator does not physically contact the support substrate, the array of pixels, or the pixel interconnects; and
        the patterned electrical insulator is configured to contract and expand during temperature cycling of the focal plane array without outgassing or fracturing the support substrate, the read-out integrated circuit, or the pixel interconnects.

13. A method of fabricating a focal plane array comprising:
    forming an array of pixels capable of detecting optical radiation in a predetermined wavelength band onto a support substrate transparent to optical radiation in the predetermined wavelength band;
    providing a read-out integrated circuit having an array of pixel contacts positioned such that the pixel contacts are aligned with the array of pixels;
    affixing a patterned electrical insulator onto the read-out integrated circuit, wherein the patterned electrical insulator comprises a plurality of intersecting walls defining a plurality of cells; and bonding the array of pixels onto the array of pixel contacts with a plurality of corresponding pixel interconnects comprising a plurality of bonding bumps positioned between corresponding ones of the pixels and pixel contacts, wherein the pixel interconnects are contained within the cells defined by the intersecting walls and the patterned electrical insulator does not physically contact the support substrate or the array of pixels.

14. A method as claimed in claim 13 wherein the method further comprises bonding the read-out integrated circuit onto a focal plane array substrate.

15. A method as claimed in claim 13 wherein the patterned electrical insulator is configured to block migration of the bonding bumps resulting from thermal cycling, thereby preventing electrical shorts between adjacent pixels of the pixel array.

16. A method as claimed in claim 13 wherein the patterned electrical insulator comprises a photosensitive cyclic olefin polymer.

17. A method of fabricating a focal plane array comprising:
  forming an array of pixels capable of detecting optical radiation in a predetermined wavelength band onto a support substrate transparent to optical radiation in the predetermined wavelength band;
  providing a read-out integrated circuit having an array of pixel contacts positioned such that the pixel contacts are aligned with the array of pixels;
  affixing a patterned electrical insulator onto the read-out integrated circuit, wherein the patterned electrical insulator comprises a plurality of intersecting walls defining a plurality of cells; and
  bonding the array of pixels onto the array of pixel contacts with a plurality of corresponding pixel interconnects comprising a plurality of bonding bumps positioned between corresponding ones of the pixels and pixel contacts;
  wherein:
    the pixel interconnects are contained within the cells defined by the intersecting walls and the patterned electrical insulator does not physically contact the support substrate or the array of pixels; and
    the patterned electrical insulator comprises a photosensitive organic polymer material that is configured to contract and expand during temperature cycling of the focal plane array without fracturing the support substrate, the read-out integrated circuit, or the pixel interconnects.

18. A method as claimed in claim 17 wherein the patterned electrical insulator comprises a photosensitive cyclic olefin polymer.

19. A method as claimed in claim 17 wherein applying the patterned electrical insulator further comprises:
  depositing a layer of the organic polymer onto the read-out integrated circuit;
  heating the organic polymer and the read-out integrated circuit;
  applying a patterned mask to the organic polymer patterned such that the pattern surrounds individual ones of the pixel contacts upon development;
  exposing the patterned mask and the organic polymer to ultraviolet light;
  applying a developer solvent to the organic polymer; and
  rinsing the organic polymer with an organic solvent.

20. A method as claimed in claim 19 wherein applying the patterned electrical insulator further comprises removing residual organic polymer material on the read-out integrated circuit by a plasma ash process.

21. A method as claimed in claim 19 wherein the heating the organic polymer and the read-out integrated circuit comprises heating the organic polymer and the read-out integrated circuit at 100° C. for one minute.

22. A method as claimed in claim 19 wherein the organic polymer is deposited onto the read-out integrated circuit at about a 5 μm thickness.

23. A method as claimed in claim 17 wherein the electrical insulator is substantially free of outgassing during temperature cycling in the range of approximately 373 Kelvin to approximately 77 Kelvin.

24. A method of preventing indium migration in a focal plane array comprising a support substrate, a read-out integrated circuit comprising a plurality of pixel contacts and a plurality of pixels positioned on the support substrate having a gap therebetween and connected to corresponding pixel contacts by indium bumps, wherein the pixels, pixel contacts and indium bumps define a plurality of pixel interconnects having a gap therebetween, the method comprising;
  affixing a patterned electrical insulator comprising a layer of photosensitive organic polymer onto the read-out integrated circuit within the gaps between the pixel interconnects such that the patterned electrical insulator surrounds each pixel interconnect and does not physically contact the transparent substrate or the plurality of pixels;
  heating the organic polymer and the read-out integrated circuit;
  applying a patterned mask to the organic polymer patterned such that the pattern surrounds individual ones of the pixel contacts upon development;
  exposing the patterned mask and the organic polymer to ultraviolet light;
  applying a developer solvent to the organic polymer; and
  rinsing the organic polymer with an organic solvent.

* * * * *